US007933471B2

(12) United States Patent
Li et al.

(10) Patent No.: US 7,933,471 B2
(45) Date of Patent: Apr. 26, 2011

(54) METHOD AND SYSTEM FOR CORRELATING PHYSICAL MODEL REPRESENTATION TO PATTERN LAYOUT

(75) Inventors: Jianliang Li, Hillsboro, OR (US); Qiliang Yan, Portland, OR (US); Lawrence S. Melvin, III, Hillsboro, OR (US); James P. Shiely, Aloha, OR (US)

(73) Assignee: Synopsys, Inc., Mountain View, CA (US)

( * ) Notice: Subject to any disclaimer, the term of this patent is extended or adjusted under 35 U.S.C. 154(b) by 1081 days.

(21) Appl. No.: 11/716,511

(22) Filed: Mar. 9, 2007

(65) Prior Publication Data
US 2008/0219590 A1 Sep. 11, 2008

(51) Int. Cl.
*G06K 9/00* (2006.01)
*G06K 9/36* (2006.01)
*G06K 9/64* (2006.01)

(52) U.S. Cl. ......... 382/279; 382/276; 382/278; 382/144

(58) Field of Classification Search .................. 382/276, 382/279, 144; 345/615; 708/420
See application file for complete search history.

(56) References Cited

U.S. PATENT DOCUMENTS

| 4,720,871 | A  * | 1/1988  | Chambers ....................... 382/278 |
| 5,790,692 | A  * | 8/1998  | Price et al. ..................... 382/133 |
| 6,970,597 | B1 * | 11/2005 | Olding et al. ................... 382/167 |
| 7,328,424 | B2 * | 2/2008  | Kohle .............................. 716/19 |
| 7,397,948 | B1 * | 7/2008  | Cohen et al. ................... 382/167 |
| 7,450,735 | B1 * | 11/2008 | Shah et al. ..................... 382/103 |
| 2005/0185159 | A1 * | 8/2005 | Rosenbluth et al. ............ 355/53 |
| 2007/0038972 | A1 * | 2/2007 | Noelscher et al. .............. 716/21 |
| 2007/0086655 | A1 * | 4/2007 | Simard et al. ................. 382/190 |
| 2007/0218176 | A1 * | 9/2007 | Adam ............................ 426/489 |
| 2008/0170773 | A1 * | 7/2008 | Wihl et al. ..................... 382/144 |

* cited by examiner

*Primary Examiner* — Vikkram Bali
*Assistant Examiner* — Michelle Entezari
(74) *Attorney, Agent, or Firm* — Park, Vaughan, Fleming & Dowler LLP; Shun Yao

(57) ABSTRACT

One embodiment of the present invention provides a system that reduces computational complexity in simulating an image resulting from an original mask and an optical transmission system. During operation, the system obtains a set transmission cross coefficient (TCC) kernel functions based on the optical transmission system, and obtains a set of transmission functions for a representative pattern which contains features representative of the original mask. The system constructs a new set of kernel functions based on the TCC kernel functions and the transmission functions for the representative pattern, wherein responses to the new kernel functions in a resulting image corresponding to the representative pattern are substantially uncorrelated with one another. The system further produces an intensity distribution of a resulting image corresponding to the original mask based on the new kernel functions, thereby facilitating prediction of a layout that can be produced from the original mask.

21 Claims, 8 Drawing Sheets

METHOD AND SYSTEM FOR CORRELATING PHYSICAL MODEL REPRESENTATION TO PATTERN LAYOUT

BACKGROUND

1. Field of the Invention

The present invention relates to manufacturing of semiconductor devices. More specifically, the present invention relates to a method and system for correlating a physical model representation to a pattern layout.

2. Related Art

As integration densities on a semiconductor chip continue to increase at an exponential rate, it is becoming progressively more difficult to compensate for optical effects incurred during the optical lithography process. These optical effects can cause undesirable distortion, lower product yield, and reduce product profitability.

To remedy this problem, designers often use a model-based optical proximity correction (OPC) process to adjust the layout and compensate for optical effects. During OPC, edges in the layout are divided into segments, and each segment is adjusted with a positive or negative bias based upon a deviation between the desired layout and the simulated layout. In addition, one can use assist features (AFs), which are additional chrome regions outside the circuit areas, to assist formation of the desired feature shapes or to enhance the depth of focus for the layout.

To produce a high-quality layout on a wafer, process engineers generally perform iterative prediction-and-correction cycles with trial mask patterns. The quality of the final mask largely depends on the accuracy of the simulation model used in each cycle. However, the cost of accurate simulation becomes increasingly high as the competitive semiconductor market pushes the processing technologies to deep-sub-micron levels. Today's layout resolution has long surpassed the wavelength of visible light and requires short-wavelength light sources such as X-Ray sources. As a result, complex and costly electromagnetic modeling is necessary to accurately capture the optical imaging behavior of a modern lithography system.

Hence, what is needed is a method and system that facilitates expedited and accurate modeling of an optical imaging system.

SUMMARY

One embodiment of the present invention provides a system that reduces computational complexity in simulating an image resulting from an original mask and an optical transmission system. During operation, the system obtains a set transmission cross coefficient (TCC) kernel functions based on the optical transmission system, and obtains a set of transmission functions for a representative pattern which contains features representative of the original mask. The system reconstructs a new set of kernel functions based on the TCC kernel functions and the transmission functions for the representative pattern, wherein responses to the new kernel functions in a resulting image corresponding to the representative pattern are substantially uncorrelated with one another. The system further produces an intensity distribution of a resulting image corresponding to the original mask based on the new kernel functions, thereby facilitating prediction of a layout that can be produced from the original mask.

In a variation on this embodiment, each of the new kernel function is a linear combination of the TCC kernel functions.

In a variation on this embodiment, constructing the new kernel functions involves identifying an orthogonal rotation matrix R, wherein $RR^T=I$, and wherein I is an identity matrix, and computing a product UR, wherein U is a TCC kernel matrix.

In a further variation, identifying the rotation matrix R involves solving for eigenvalues of $(U^TX^TXU)$, wherein X is a transmission-function matrix for the representative pattern, and solving for eigenvectors of $(U^TX^TXU)$, wherein each eigenvector is a column in the rotation matrix R.

In a further variation, producing the intensity distribution of the resulting image involves selecting a predetermined number of the new kernel functions, and computing a sum of convolutions between a set of mask transmission functions for the original mask and the selected new kernel functions based on the Hopkins model.

In a variation on this embodiment, the system allows a user to provide the representative pattern.

In a variation on this embodiment, the system derives the representative pattern based on the original mask

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now know or later developed.

Overview

Figure 1:
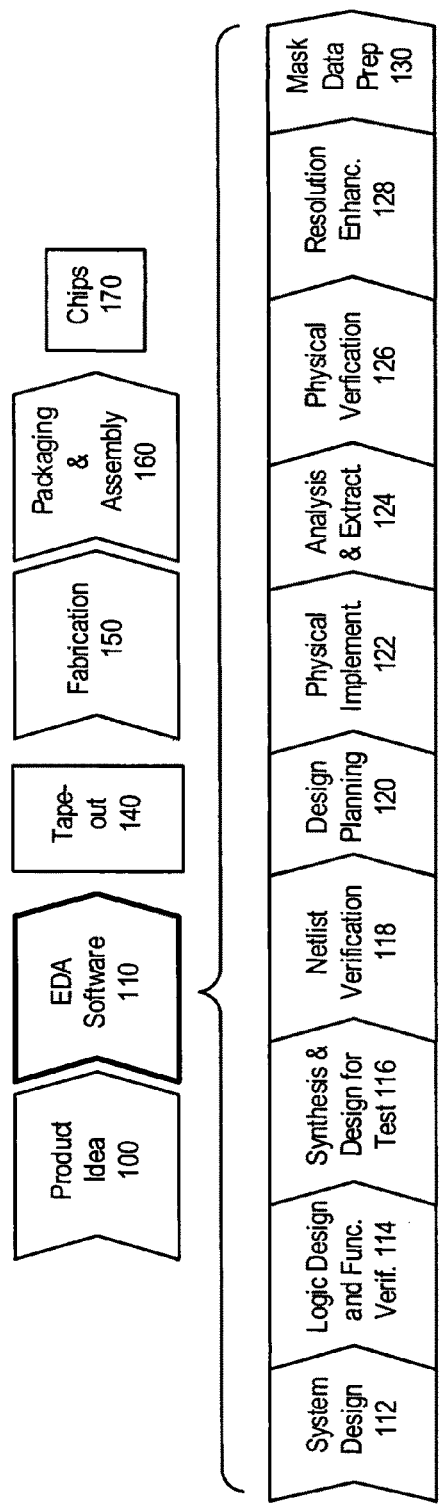
FIG. 1 illustrates various stages in the design and fabrication of an integrated circuit.

FIG. 1 illustrates various stages in the design and fabrication of an integrated circuit. The process starts with the generation of a product idea (stage 100), which is realized using an Electronic Design Automation (EDA) software design process (stage 110). When the design is finalized, it can be taped-out (stage 140). After tape out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS INC. that can be used at this stage include MODEL ARCHITECT®, SABER®, SYSTEM STUDIO®, and DESIGN WIRE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS INC. that can be used at this stage include VCS®, VERA®, DDESIGNWARE®, MAGELLAN®, FORMALITY®, ESP® and LEDA® products.

Synthesis and design for test (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPLIER®, PHYSICAL COMPILER®, TEST COMPILER®, POWER COMPILER®, FPGA COMPILER®, TETRAMAX®, and DESIGNWAREB® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level, this in turn permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the "tape-out" data for production of masks to produce finished chips. Exemplary EDA software products from SYNOPSYS, INC. that can be used at this stage include the CATS® family of products.

Embodiments of the present invention can be used during one or more of the above described stages. Specifically, one embodiment of the present invention can be used during the resolution enhancement stage 128.

Semiconductor manufacturing technologies typically include a number of processes which involve complex physical and chemical interactions. These interactions can result in process variations and cause the characteristics of the actual integrated circuit to deviate from the original design. If this difference is too large, manufacturing problems can occur and reduce the yield and/or reduce the performance of the integrated circuit.

Process variations can arise due to a variety of reasons. For example, in photolithography, variations in the rotation speed of the spindle can cause the resist thickness to vary, which can cause variations in the reflectivity, which, in turn, can cause unwanted changes to the pattern's image. Similarly, bake plates—which are used to drive the solvents out of the wafer and form the pattern in photoresist—can have hot or cold spots, which can cause variations in the critical dimension (CD).

Figure 2:
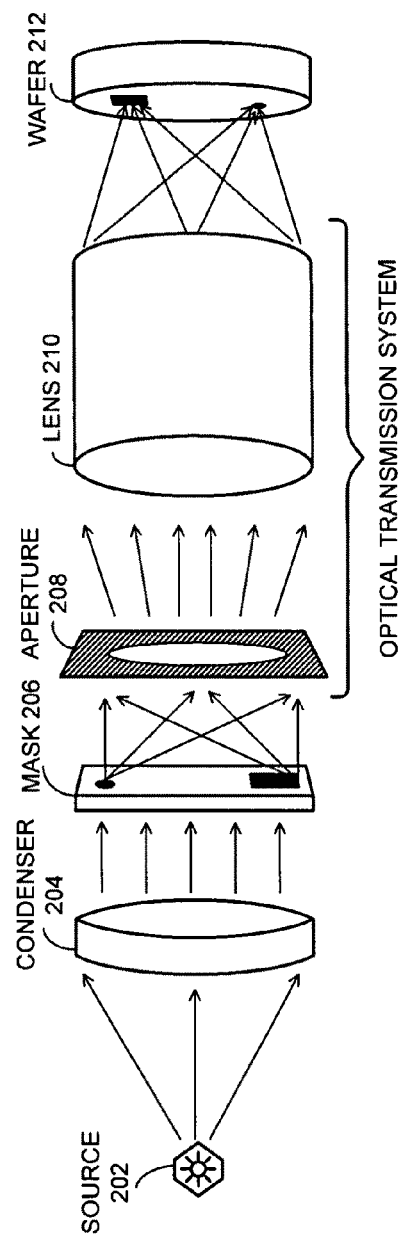
FIG. 2 illustrates a typical optical system used for exposure in optical lithography.

Optical projection systems employed in optical lithography at present typically utilize partially coherent illumination. FIG. 2 illustrates a typical optical system used for exposure in optical lithography. Radiation from source 202 is first collimated by a condenser 204. The collimated light then passes through a mask 206, an aperture 208, a lens body 210, and forms images on a wafer 212.

Traditionally, the Hopkins model has been used to model this optical imaging system. General information on photolithography and the Hopkins model can be found in Alfred Kwok-Kit Wong, *Optical Imaging in Projection Microlithography*, SPIE-International Society for Optical Engine, 2005, and Grant R. Fowles, *Introduction to Modern Optics*, $2^{nd}$ *Edition*, Dover Publications, 1989.

In a sufficiently general setting, the process of partially coherent optical imaging may be described as a 2D convolution based on the Hopkins model:

$$I(x,y) = \iiiint M(x_1,y_1) T(x-x_1,y-y_1;x-x_2,y-y_2) M^*(x_2,y_2) dx_1 dx_2 dy_1 dy_2,$$

where $M(x, y)$ is the 2D mask transmission function, $M^*$ is the complex conjugate of $M$, and $T(x-x_1,y-y_1;x-x_2,y-y_2)$ is a 4D matrix called the Transmission Cross Coefficient (TCC) matrix which models the optical system. The TCC matrix can be diagonalized to a set of orthogonal 2D kernels, which can be determined by the eigenvectors of the TCC matrix. The image intensity on the wafer can then be computed by convolving the kernels with the mask.

In one embodiment, the TCC is given by:

$$T(x-x_1,y-y_1;x-x_2,y-y_2)=J_0(x_1-x_2,y_1-y_2)K(x-x_1,y-y_1)K^*(x-x_2,y-y_2),$$

where $J_0(x, y)$ is the 2D mutual intensity function that describes the coherent properties of the illumination system, $K(x, y)$ is the 2D coherent point spread function that represents the properties of the projection system, and $K^*$ is the complex conjugate of $K$.

After coherent decomposition, the TCC can be represented using its eigenvectors as follows:

$$T(x_1, y_1; x_2, y_2) = \sum_{i=1}^{\infty} \lambda_i K_i(x_1, y_1) K_i^*(x_2, y_2),$$

where $\lambda_i$ is the eigenvalue corresponding to the eigenvector $K_i(x, y)$ and $K_i^*$ is the complex conjugate of $K_i$.

The aerial image intensity $I(x, y)$ can be represented using the TCC eigenvalues and eigenvectors as follows:

$$I(x, y) = \sum_{i=1}^{\infty} \lambda_i \left| \int \int M(x_1, y_1) K_i(x-x_1, y-y_1) dx_1 dy_1 \right|^2.$$

In the equation above, each eigenvector $K_i$ represents the transfer function for a coherent imaging system. The aerial image intensity $I(x, y)$ is then computed as the sum of the images produced by an infinite number of coherent systems, which can be an impractical task due to computational complexities. Hence, a simulation process typically retains n kernels to reach an nth-order coherent approximation of the system.

Generally, the accuracy of the Hopkins model depends on how many kernels are retained during the simulation. More retained kernels result in more accurate modeling. However, more kernels also lead to extended simulation runtime. With the current modeling technique, one round of simulation can often consume many hours or even days. Such long runtimes can severely hinder device design and impact product life cycle. Therefore, it is desirable to reduce the number of kernels without sacrificing accuracy.

Reconstruction of Kernels

The selection of kernels is conventionally based on their eigenvalues. For example, the system can retain the kernels with the n largest eigenvalues. This kernel-selection approach functions well when the mask pattern mainly contains arbitrary, uncorrelated patterns. However, a realistic mask pattern often contains regular shapes and arrangements, and the kernel responses to such patterns can exhibit a certain level of correlation. In other words, given a non-arbitrary pattern, the eigenvalue of a kernel may not reflect the actual magnitude of the corresponding kernel response. As a result, we can reconstruct the kernels to more effectively capture such response correlation and, in turn, reduce the amount of computation complexity.

Figure 3:
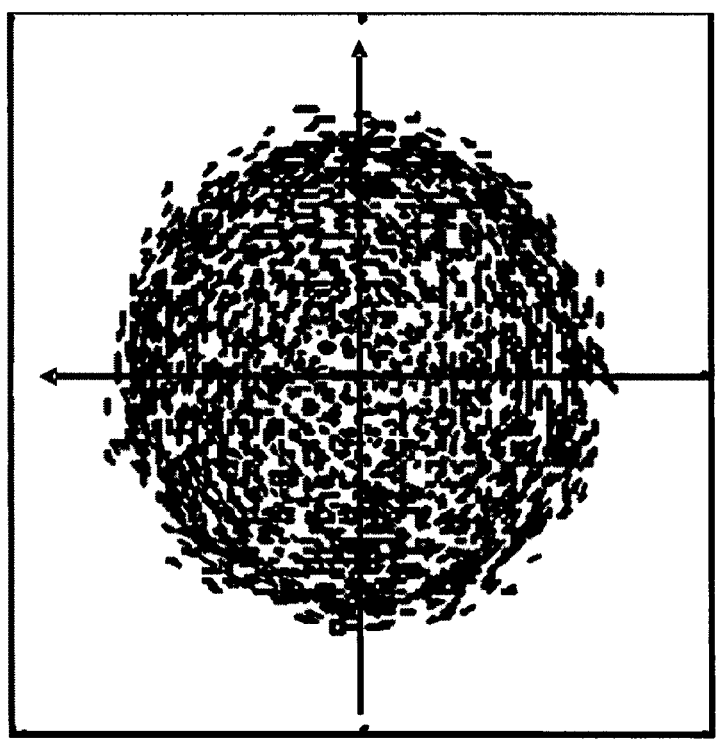
FIG. 3 presents an exemplary plot illustrating the lack of correlation between responses to two kernels in an image resulting from an arbitrary pattern.

FIG. 3 presents an exemplary plot illustrating the lack of correlation between responses to two kernels in an image resulting from an arbitrary pattern. In this example, a number of sample points are selected on the mask pattern. Each sample point is then subject to the simulation model and the corresponding kernel responses are computed. FIG. 3 shows the magnitude of responses to two representative kernels, namely Kernel 1 and Kernel 2. The vertical axis corresponds to the magnitude of response to Kernel 1, and the horizontal axis to the magnitude of response to Kernel 2.

Because the mask pattern contains arbitrary patterns, the kernel responses with respect to Kernel 1 and Kernel 2 exhibit no statistical correlation. As is shown in FIG. 3, the coordinate of each response point correspond to a response to Kernel 1 and a response to Kernel 2. Collectively, all the sample point responses form a circular area centered at a given point.

Figure 4:
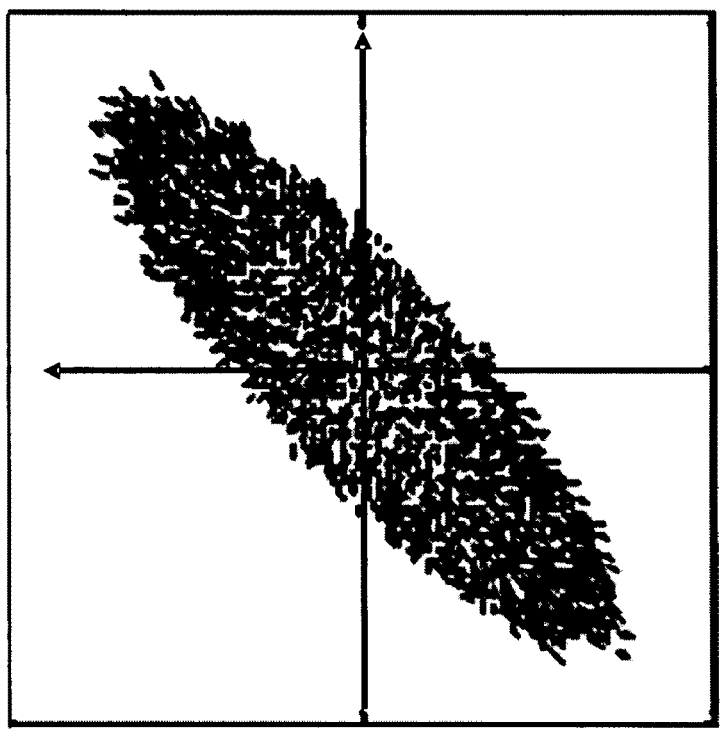
FIG. 4 presents an exemplary plot illustrating the presence of correlation between responses to two kernels in an image resulting from a real-world pattern.

FIG. 4 presents an exemplary plot illustrating the presence of correlation between responses to two kernels in an image resulting from a real-world pattern. In this example, the mask pattern contains non-arbitrary patterns. As a result, the image exhibits some correlation between the responses to Kernel 1 and Kernel 2. Particularly, the plot of the sample point responses appears to be an oval in the X-Y direction, which indicates a correlation between Kernel 1 response and Kernel 2 response. That is, the magnitude of response to (Kernel 1+Kernel 2)/2 is significantly larger than the magnitude of response to (Kernel 1−Kernel 2)/2. Hence, the simulation can use a pair of new kernels based on a linear combination of the original kernels: (Kernel 1+Kernel 2)/2 and (Kernel 1−Kernel 2)/2. Furthermore, since (Kernel 1−Kernel 2)/2 contributes far less to the final response than (Kernel 1+Kernel 2)/2, the simulation only needs to retain one kernel, (Kernel 1+Kernel 2)/2, to compute the final image without sacrificing much accuracy.

This example illustrates that it is possible to reconstruct a set of new kernels, based on the original TCC kernels, to facilitate reduction of kernels in the simulation. Note that the example shown in FIG. 4 is for illustration purposes only. A real-world OPC process often involves a larger number of kernels, and reconstruction of the new kernels requires more complex manipulation. Therefore, the goal is to identify a set of new kernels, each of which is a linear combination of the original kernels, such that the responses to the new kernels in the resulting image of a pattern is substantially uncorrelated. Furthermore, the eigenvalues corresponding to these new kernels can indicate the magnitude of response to each new kernel in the final image. The process of reconstructing new kernels is described in more details below.

In practice, the nth-order coherent approximation of the intensity of an aerial image can be represented as:

$$I(x, y) = \sum_{i=1}^{n} \lambda_i \left| \int \int M(x_1, y_1) K_i(x-x_1, y-y_1) dx_1 dy_1 \right|^2.$$

By analyzing the kernels' responsivity to $M(x, y)$, it is possible to reconstruct the new kernels with improved representation. To simplify the analysis, one can express the aerial image intensity in a vector and matrix format, since all of the mask transmission functions and the kernel functions are decomposed into a set of basis functions. In one embodiment, the kernel functions are decomposed into Fourier-Bessel functions. In general, embodiments of the present invention can work with any kernel-decomposition schemes. Assume that the mask transmission functions are expressed as a vector X, and the eigenvectors (or eigenfunctions) of TCC are expressed as $u_i$. The aerial image intensity can be written as:

$$I(x, y) \approx \sum_{i=1}^{n} (X^T u_i)^2 = X^T U U^T X$$

Where U represents the model matrix or TCC matrix. Note that each element in vector X and $u_i$ is a function of the sampling point (x, y).

To construct the new kernels, we insert a norm-orthogonal rotation matrix R between U and $U^T$ in the equation above:

$$I(x,y) \approx \sum_{i=1}^{n} (X^T u_i)^2 = X^T U R R^T U^T X$$

Note that since $RR^T=I$, where I is the identity matrix, both sides of the equation above remains unchanged.

If R is appropriately defined, the eigenvalues of the new kernels UR can correctly reflect the contribution of each new kernel to the aerial image. As a result, the OPC system can select the most effective kernels for the simulation. In one embodiment, rotation matrix R is defined such that each of the term in the summation equation for the aerial image intensity is maximized. That is, the goal is to "squeeze" as much response magnitude as possible into the first few terms in the summation, so that the modeling process can use as few kernels as possible.

One approach to identify this rotation matrix R is to maximize each term in the summation, $X^T U r_i$, one by one, with the best vector $r_i$, which is a unit vector and represents the ith column of rotation matrix R. For instance, consider the first term, $X^T U r_1$. Suppose that the mask pattern has s sampling points. A new mask transmission-function matrix X can be constructed with the mask transmission-function vectors $X_j$ at the sampling points as:

$$X = \begin{bmatrix} X_1^T \\ X_2^T \\ \vdots \\ X_s^T \end{bmatrix},$$

wherein each vector $X_j$ represents a series of coefficients for the decomposition of the mask transmission function.

The first summation term in the expression for the aerial image intensity at all the sampling points can be expressed as a vector $e_1$:

$$e_1 = \begin{bmatrix} X_1^T U r_1 \\ X_2^T U r_1 \\ \vdots \\ X_s^T U r_1 \end{bmatrix} = X U r_1$$

Note that the norm of the above vector, $e_1^T e_1$, represents the sum of the optical signal contributed by the first kernel. Hence, $e_1^T e_1 = r_1^T U^T X^T X U r_1$ is to be maximized.

Following the same reasoning, the ith column of the rotation matrix R is the unit vector that maximizes the above quadratic form, subject to the constraint that it is orthogonal to the previous i−1 vectors in R. One can use the Lagrangian Multiplier method to solve for all the R vectors $r_i$ (i=1, ..., n).

We first construct the following objective function:

$$y(r) = r^T U^T X^T X U r + \lambda(r^T r - 1).$$

The partial derivative of y(r) with respect to r is:

$$\frac{\partial y(r)}{\partial r} = 2 U^T X^T X U r + 2\lambda r.$$

By setting the partial derivative to zero, one obtains:

$$(U^T X^T X U) r = -\lambda r.$$

It is immediately recognized that $r_i$ are actually the eigenvectors of the matrix $U^T X^T X U$, denoted as the Q matrix.

Therefore, by solving for the eigenvectors and eigenvalues of the Q matrix, one can construct the rotation matrix R, and further reconstruct the new kernel matrix UR. After obtaining the new kernels, the system can selectively retain the n new kernels with the n largest eigenvalues ($\lambda_i$). These eigenvalues reflect the actual contribution to the optical signal on the aerial image by the new kernels.

In one embodiment, the system uses a smaller-scale representative pattern, instead of the actual original mask pattern, to reconstruct the new kernels. This representative pattern can contain the main features in the original mask pattern, and the arrangement representative of the feature arrangement on the mask. By using this smaller-scale representative pattern, the system can reduce the computation complexity involved in solving for the new kernels. Note that one way to generate a representative pattern is to simply cut away a piece of the mask pattern that contains representative polygons. Alternatively, a manually selected or designed representative pattern can be used. In one embodiment, the system can automatically generate the representative pattern from the test mask pattern by selecting a pre-determined or arbitrary area of the mask pattern.

Figure 5:
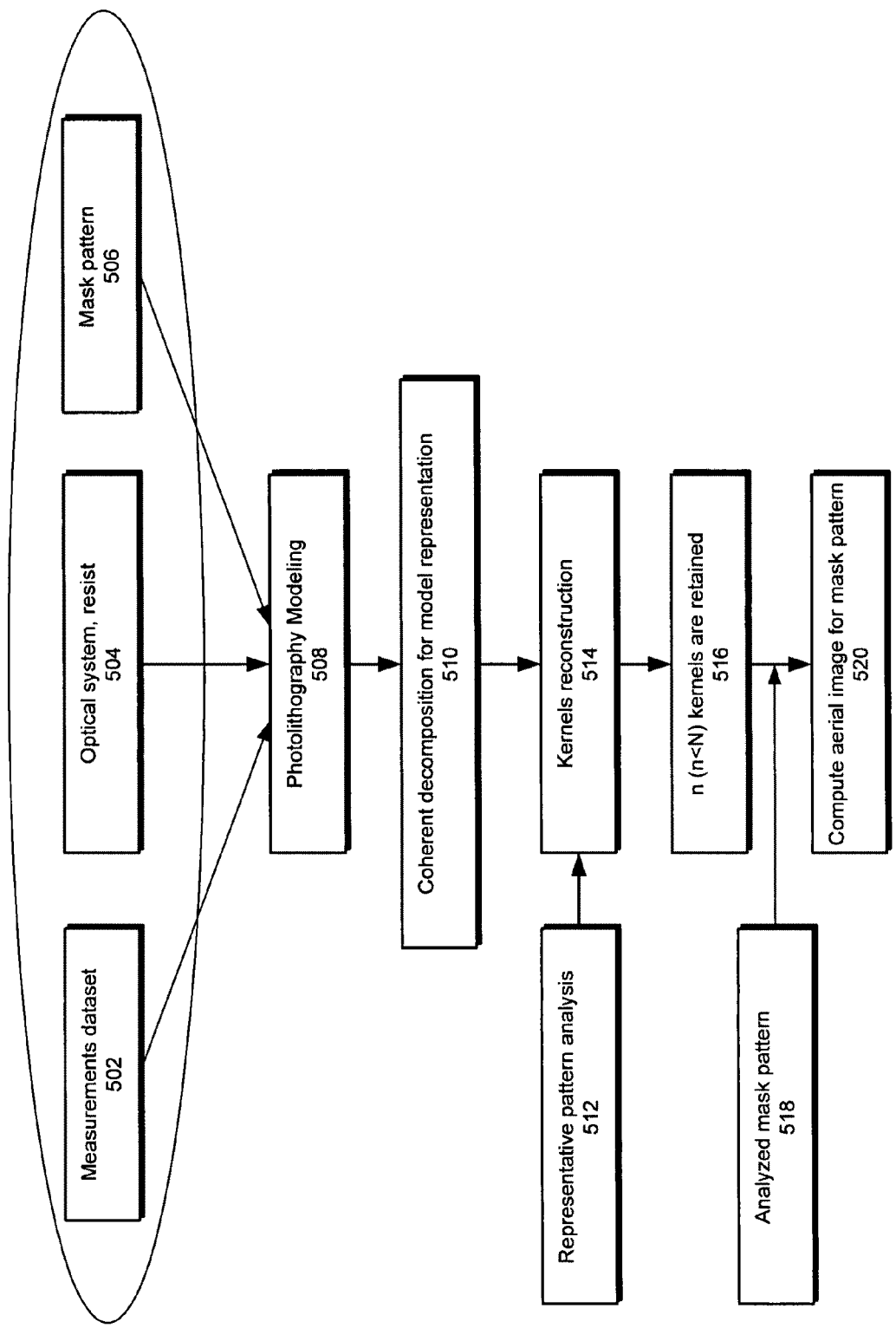
FIG. 5 presents a flow chart illustrating the process of reconstructing kernels in accordance with an embodiment of the present invention.

FIG. 5 presents a flow chart illustrating the process of reconstructing kernels in accordance with an embodiment of the present invention. During operation, the system first construct the photolithography models (stage 508) based on a measurements dataset 502, a set of optical system and photo resist information 504, and the test mask pattern 506. The system further performs a coherent decomposition for the photolithography model representations (stage 510).

In addition, the system performs analysis and coherent decomposition on a representative pattern (stage 512). Then, based on the representative pattern models and the optical-system models, the system reconstructs the new kernels (stage 514) and retains n new kernels (stage 516). Based on the analyzed pattern set 518 and the n new kernels, the system computes the aerial image for the mask pattern (stage 520).

Illustrative Results

For purposes of illustration, a set of experimental results are presented herein for comparison of the efficacy between the new kernels and the conventional kernels.

Figure 6:
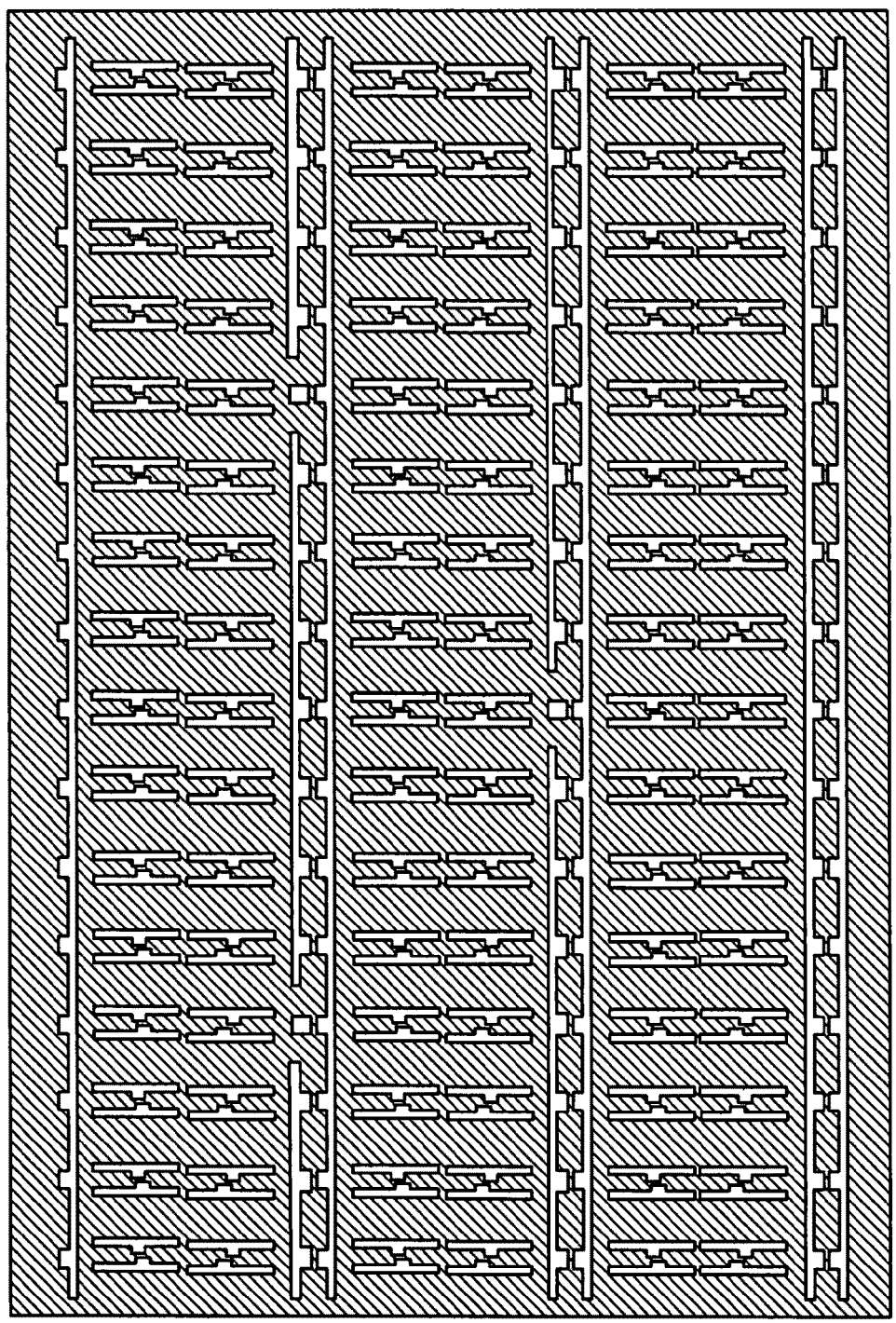
FIG. 6 illustrates an exemplary representative pattern used for reconstructing kernels in accordance with an embodiment of the present invention.

FIG. 6 illustrates an exemplary representative pattern in accordance with an embodiment of the present invention. This representative pattern has a much smaller scale than an actual mask pattern, but nevertheless contains the major polygon shapes and arrangement patterns as are in the mask pattern.

Figure 7:
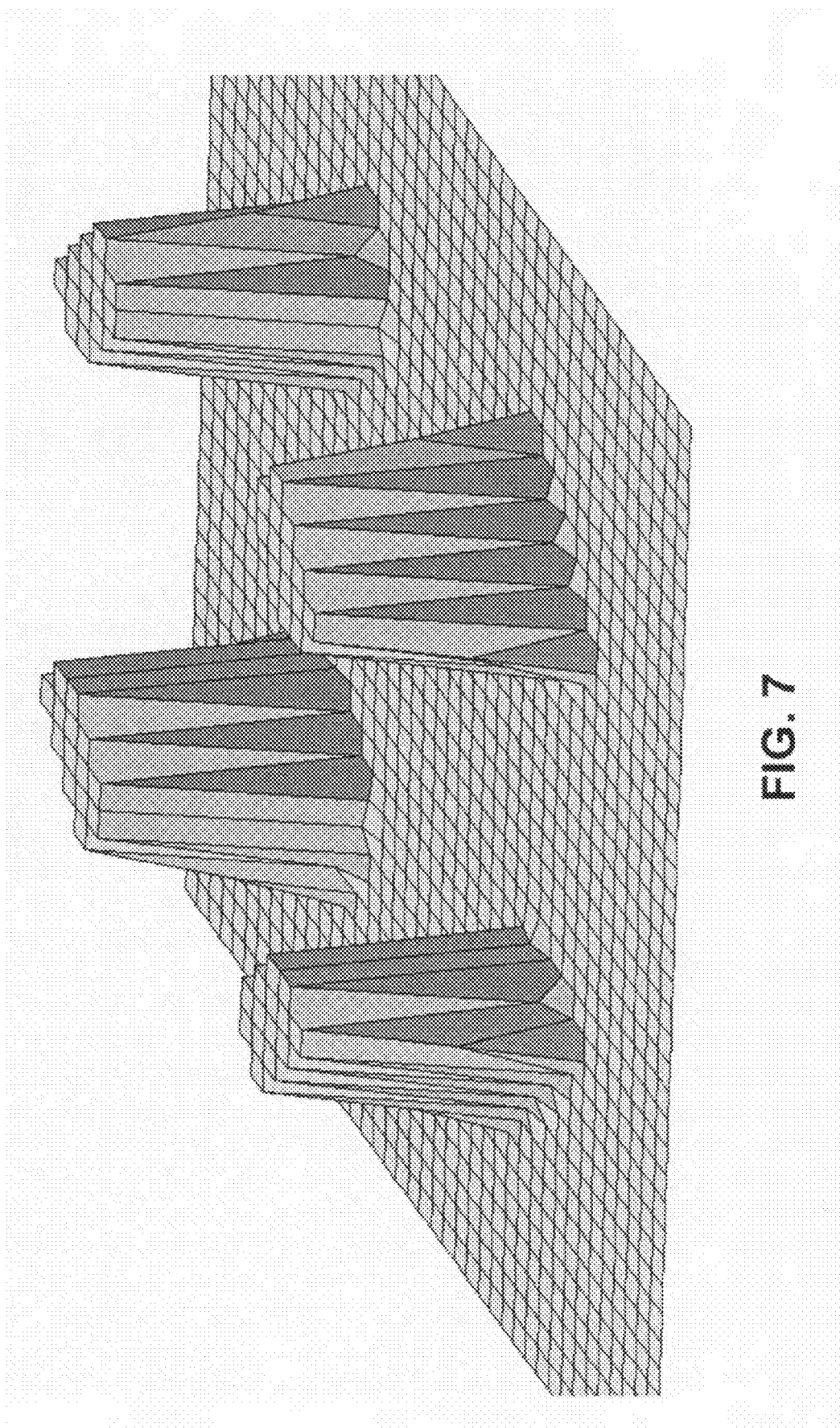
FIG. 7 illustrates a quasar illumination system used in an experiment in accordance with an embodiment of the present invention.

FIG. 7 illustrates a quasar illumination system used in an experiment in accordance with an embodiment of the present invention. The illumination system provides four pulses in the spatial-frequency domain. The wavelength used for illumination 193 nm, and the numerical aperture is 0.8.

Figure 8:
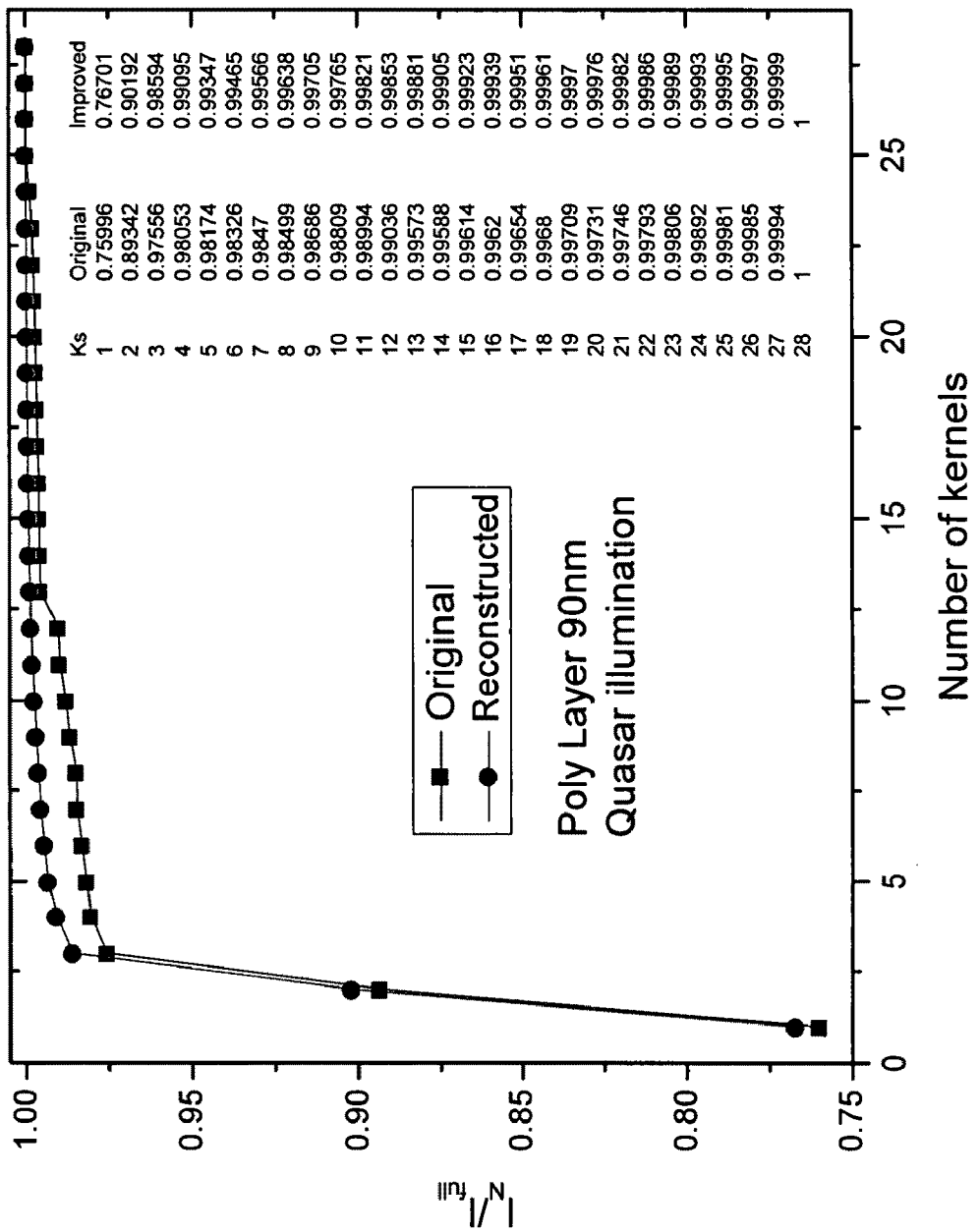
FIG. 8 presents two sets of simulation results based on original kernels and improved kernels, respectively, in accordance with an embodiment of the present invention.

FIG. 8 presents two sets of simulation results based on original kernels and improved kernels, respectively, in accordance with an embodiment of the present invention. The Y-axis indicates the error rate. Note that, for reference, the total intensity obtained with a large number of original kernels is regarded as the target result. In this case, the image intensity obtained with 28 original kernels is used as a reference, and the error is calculated as $I_N/I_{full}$, wherein $I_N$ is the intensity obtained with N kernels, and $I_{full}$ is the intensity obtained with 28 original kernels. As is shown in FIG. 8, with 4 reconstructed kernels, the system can reach a 99% accuracy. In contrast, the system needs 12 original kernels to reach the same level of accuracy. Furthermore, a 99.9% accuracy requires 25 original kernels, but only 14 reconstructed kernels. The cost savings from the reconstructed kernels are significant.

Figure 9:
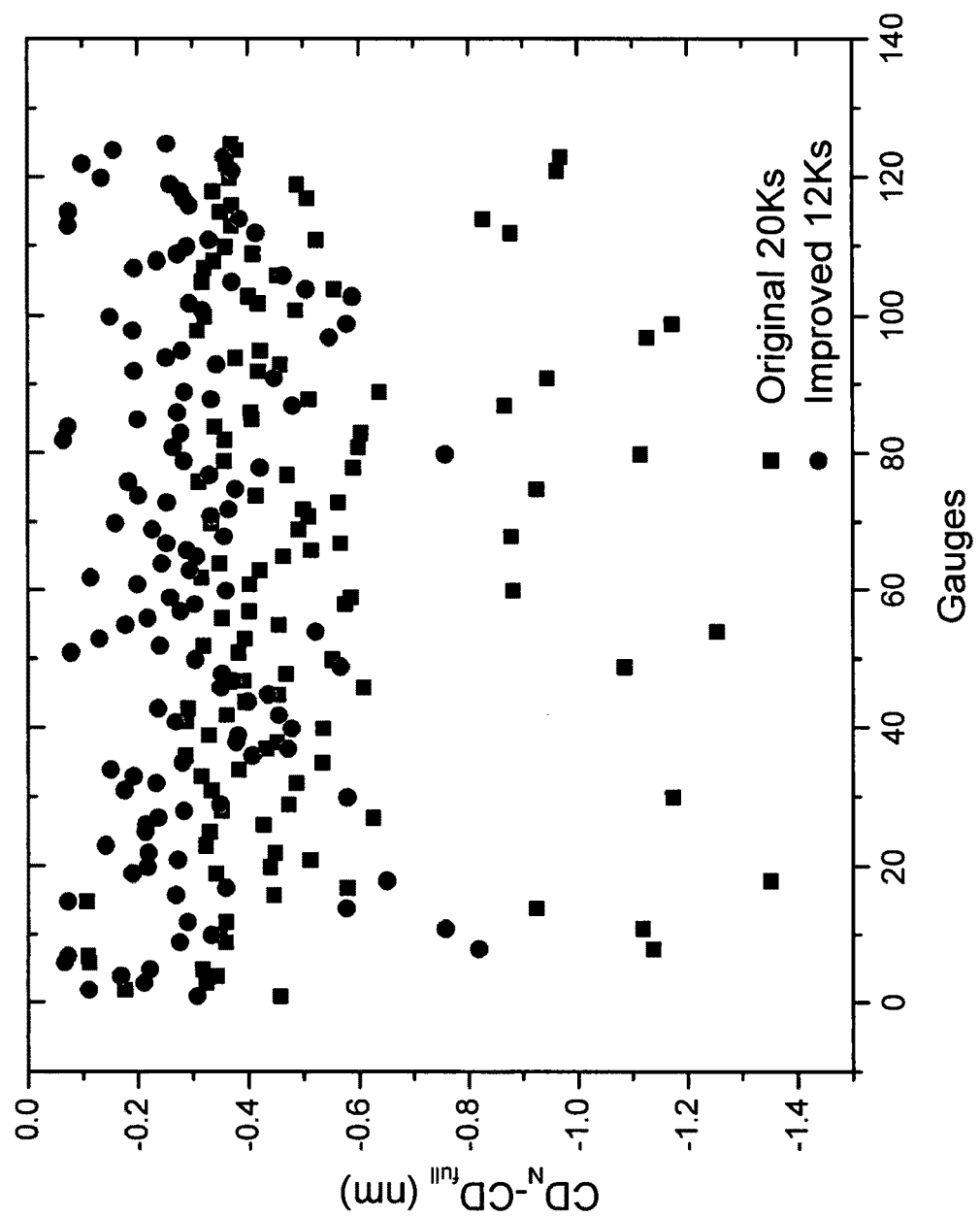
FIG. 9 presents two sets of critical dimension (CD) errors based on original kernels and improved kernels, respectively, in accordance with an embodiment of the present invention.

FIG. 9 presents two sets of critical dimension (CD) errors based on a set of original kernels and improved kernels, respectively, in accordance with an embodiment of the present invention. In this comparison, one set of results, represented by square-shaped points, are obtained with 20 original kernels. The second set of results, represented by circular-shaped points, are obtained with 12 reconstructed kernels. The Y-axis denotes the critical-dimension deviation from the results obtained with 28 original models. Each point represents the result for a sampling point on the mask pattern. As is shown in FIG. 9, both the absolute error and the standard deviation of error for the results obtained with the 12 reconstructed kernels are significantly less than the results obtained with the 20 original kernels.

System Operation

Figure 10:
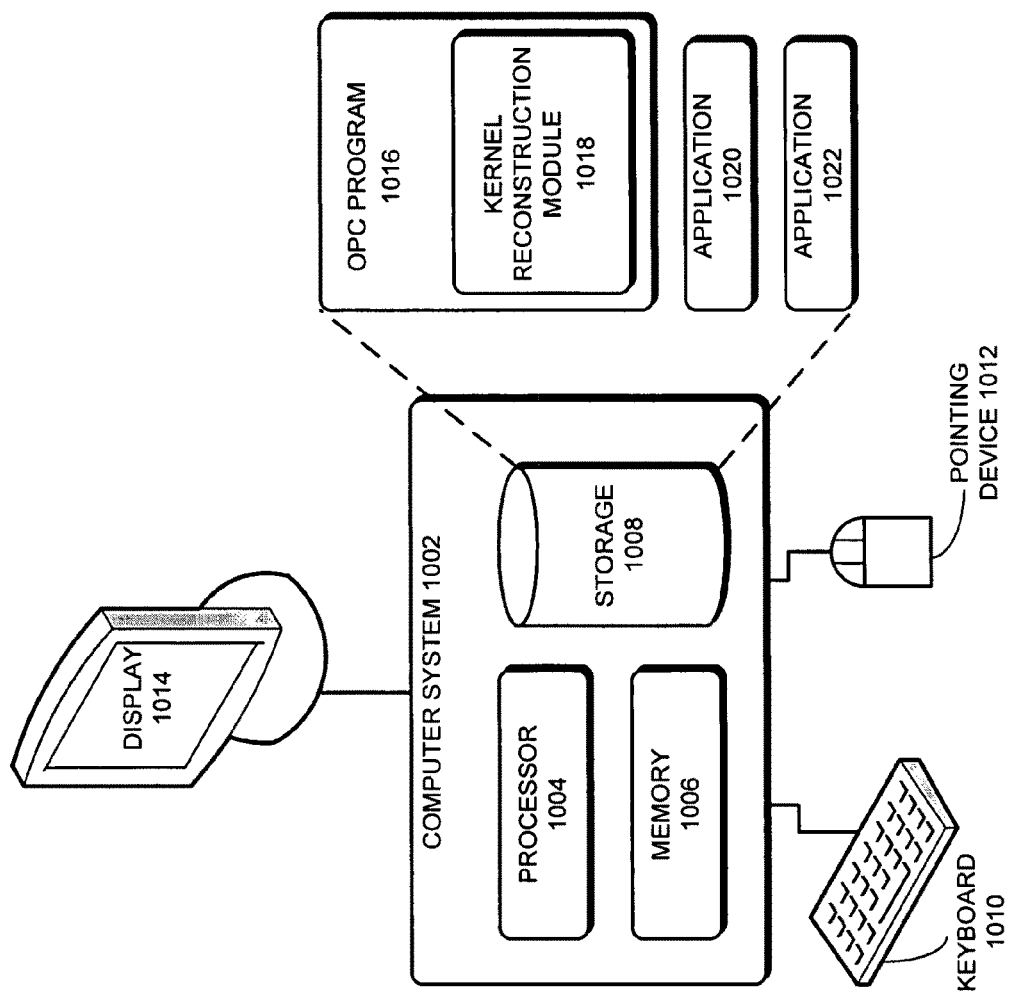
FIG. 10 presents an exemplary computer system for facilitating construction of new optical kernels in accordance with one embodiment of the present invention.

FIG. 10 presents an exemplary computer system for facilitating construction of new optical kernels in accordance with one embodiment of the present invention. A computer system 1002 comprises a processor 1004, a memory 1006, and a storage device 1008. Also coupled to computer system 1002 are a display 1014, a keyboard 1010, and a pointing device 1012. Storage device 1008 stores an OPC program 1016, which includes a kernel reconstruction module 1018. Storage device 1008 also stores additional applications, such as applications 1020 and 1022.

During operation, computer system 1002 loads OPC program 1016 and kernel reconstruction module 1018 into memory 1006. After receiving the optical models and performing the necessary coherent decomposition, processor 1004 performs the kernel reconstruction, applies the new kernels to the mask pattern, and obtains the resulting aerial image.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for reducing computational complexity in simulating an image resulting from an original mask and an optical transmission system, the method comprising:
    obtaining a set transmission cross coefficient (TCC) kernel functions based on the optical transmission system;
    obtaining a set of transmission functions for a representative pattern which contains features representative of the original mask;
    reconstructing a new set of kernel functions based on the TCC kernel functions and the transmission functions for the representative pattern, so that a first response in a resulting image of the representative pattern to a first kernel function in the new set of kernel functions is substantially uncorrelated with a second response in the resulting image of the representative pattern to a second kernel function in the new set of kernel functions; and
    producing an intensity distribution of a resulting image corresponding to the original mask based on the new kernel functions, thereby facilitating prediction of a layout that can be produced from the original mask.

2. The method of claim 1, wherein each of the new kernel function is a linear combination of the TCC kernel functions.

3. The method of claim 1, wherein constructing the new kernel functions comprises:
    identifying an orthogonal rotation matrix R, wherein $RR^T=I$, and wherein I is an identity matrix; and
    computing a product UR, wherein U is a TCC kernel matrix.

4. The method of claim 3, wherein identifying the rotation matrix R comprises:
    solving for eigenvalues of $(U^TX^TXU)$, wherein X is a transmission-function matrix for the representative pattern; and
    solving for eigenvectors of $(U^TX^TXU)$, wherein each eigenvector is a column in the rotation matrix R.

5. The method of claim 4, wherein producing the intensity distribution of the resulting image comprises:
    selecting a predetermined number of the new kernel functions; and
    computing a sum of convolutions between a set of mask transmission functions for the original mask and the selected new kernel functions based on the Hopkins model.

6. The method of claim 1, further comprising allowing a user to provide the representative pattern.

7. The method of claim 1, further comprising deriving the representative pattern based on the original mask.

8. A non-transitory computer-readable storage medium storing instructions that when executed by a computer cause the computer to perform a method for reducing computational complexity in simulating an image resulting from an original mask and an optical transmission system, the method comprising:
    obtaining a set transmission cross coefficient (TCC) kernel functions based on the optical transmission system;
    obtaining a set of transmission functions for a representative pattern which contains features representative of the original mask;
    reconstructing a new set of kernel functions based on the TCC kernel functions and the transmission functions for the representative pattern, so that a first response in a resulting image of the representative pattern to a first kernel function in the new set of kernel functions is substantially uncorrelated with a second response in the resulting image of the representative pattern to a second kernel function in the new set of kernel functions; and
    producing an intensity distribution of a resulting image corresponding to the original mask based on the new kernel functions, thereby facilitating prediction of a layout that can be produced from the original mask.

9. The computer-readable storage medium of claim 8, wherein each of the new kernel function is a linear combination of the TCC kernel functions.

10. The computer-readable storage medium of claim 8, wherein constructing the new kernel functions comprises:
    identifying an orthogonal rotation matrix R, wherein $RR^T=I$, and wherein I is an identity matrix; and
    computing a product UR, wherein U is a TCC kernel matrix.

11. The computer-readable storage medium of claim 10, wherein identifying the rotation matrix R comprises:
    solving for eigenvalues of $(U^TX^TXU)$, wherein X is a transmission-function matrix for the representative pattern; and
    solving for eigenvectors of $(U^TX^TXU)$, wherein each eigenvector is a column in the rotation matrix R.

12. The computer-readable storage medium of claim 11, wherein producing the intensity distribution of the resulting image comprises:
    selecting a predetermined number of the new kernel functions; and
    computing a sum of convolutions between a set of mask transmission functions for the original mask and the selected new kernel functions based on the Hopkins model.

13. The computer-readable storage medium of claim 8, wherein the method further comprises allowing a user to provide the representative pattern.

14. The computer-readable storage medium of claim 8, wherein the method further comprises deriving the representative pattern based on the original mask.

15. A computer system for facilitating reduction of computational complexity in simulating an image resulting from an original mask and an optical transmission system, the method comprising:
   a processor;
   a memory;
   a kernel analysis mechanism configured to obtain a set transmission cross coefficient (TCC) kernel functions based on the optical transmission system;
   a pattern analysis mechanism configured to obtain a set of transmission functions for a representative pattern which contains features representative of the original mask;
   a new-kernel construction mechanism configured to reconstruct a new set of kernel functions based on the TCC kernel functions and the transmission functions for the representative pattern, so that a first response in a resulting image of the representative pattern to a first kernel function in the new set of kernel functions is substantially uncorrelated with a second response in the resulting image of the representative pattern to a second kernel function in the new set of kernel functions; and
   a simulation mechanism configured to produce an intensity distribution of a resulting image corresponding to the original mask based on the new kernel functions, thereby facilitating prediction of a layout that can be produced from the original mask.

16. The computer system of claim 15, wherein each of the new kernel function is a linear combination of the TCC kernel functions.

17. The computer system of claim 15, wherein while constructing the new kernel functions, the new-kernel construction mechanism is configured to:
   identify an orthogonal rotation matrix R, wherein $RR^T=I$, and wherein I is an identity matrix; and
   compute a product UR, wherein U is a TCC kernel matrix.

18. The computer system of claim 17, wherein while identifying the rotation matrix R, the new-kernel construction mechanism is configured to:
   solve for eigenvalues of $(U^T X^T X U)$, wherein X is a transmission-function matrix for the representative pattern; and
   solve for eigenvectors of $(U^T X^T X U)$, wherein each eigenvector is a column in the rotation matrix R.

19. The computer system of claim 18, wherein while producing the intensity distribution of the resulting image, the simulation mechanism is configured to:
   select a predetermined number of the new kernel functions; and
   compute a sum of convolutions between a set of mask transmission functions for the original mask and the selected new kernel functions based on the Hopkins model.

20. The computer system of claim 15, further comprises allowing an input mechanism configured to allow a user to provide the representative pattern.

21. The computer system of claim 15, further comprising a derivation mechanism configured to derive the representative pattern based on the original mask.

* * * * *